(12) United States Patent
Chou

(10) Patent No.: US 7,154,211 B2
(45) Date of Patent: Dec. 26, 2006

(54) ELECTRICALLY CONNECTING STRUCTURE OF PIEZO-ELECTRIC PLATES

(75) Inventor: Chin-Wen Chou, Taipei Hsien (TW)

(73) Assignee: Zippy Technology Corp., Taipei Hsien (TW)

(*) Notice: Subject to any disclaimer, the term of this patent is extended or adjusted under 35 U.S.C. 154(b) by 0 days.

(21) Appl. No.: 11/138,255

(22) Filed: May 27, 2005

(65) Prior Publication Data

US 2006/0267457 A1  Nov. 30, 2006

(51) Int. Cl.
 *H01L 41/08* (2006.01)
(52) U.S. Cl. .................... 310/345; 310/348
(58) Field of Classification Search ............. 310/365, 310/328, 334, 338, 346, 348, 366
 See application file for complete search history.

(56) References Cited

U.S. PATENT DOCUMENTS

| | | | | |
|---|---|---|---|---|
| 3,903,733 A | * | 9/1975 | Murayama et al. | 73/574 |
| 4,458,173 A | * | 7/1984 | Kaufman et al. | 310/338 |
| 4,492,892 A | * | 1/1985 | Nakatani | 310/345 |
| 4,857,887 A | * | 8/1989 | Iten | 341/34 |
| 5,296,777 A | * | 3/1994 | Mine et al. | 310/334 |
| 5,925,974 A | * | 7/1999 | Yamamoto et al. | 310/348 |

FOREIGN PATENT DOCUMENTS

| TW | 527063 | * | 4/2003 |
|---|---|---|---|
| TW | 527067 | | 4/2003 |
| TW | 535999 | | 6/2003 |
| TW | M252149 | | 12/2004 |

* cited by examiner

*Primary Examiner*—Mark Budd
(74) *Attorney, Agent, or Firm*—Birch, Stewart, Kolasch & Birch, LLP

(57) ABSTRACT

An electrically connecting structure of piezo-electric plates includes a circuit board and a plurality of piezo-electric plates disposed on and electrically connected to the circuit board. Anodes of power input of the piezo-electric plates of the present invention are individually electrically connected to the circuit board, the cathodes of power input of the plurality of piezo-electric plates are electrically connected together for forming a circuit of power input of electrical connection of the plurality of piezo-electric plate and the circuit board.

9 Claims, 10 Drawing Sheets

ELECTRICALLY CONNECTING STRUCTURE OF PIEZO-ELECTRIC PLATES

FIELD OF THE INVENTION

The present invention relates to an electrically connecting structure of piezo-electric plates, and more particularly to an electrically connecting structure of piezo-electric plates whose cathodes of power input are electrically connected together for forming a circuit of power input of electrical connection of the plurality of piezo-electric plates and the circuit board.

BACKGROUND OF THE INVENTION

According to the design of an electrically connecting structure of piezo-electric plates, the prevent inventor has disclosed in R.O.C. (Taiwan) Patent Publication No. 527067, R.O.C. (Taiwan) Patent Publication No. 527063, R.O.C. (Taiwan) Patent No. M252149 and R.O.C. (Taiwan) Patent Publication No. 535999. In conventional technology, an anode and a cathode of the input end of the piezo-electric plate are individually electrically connected to electrodes of power supply of a circuit board by a welding manner of electrically connecting line material or a pressing and connecting manner of electrically conductive and elastic sheet so as to form a circuit. According to the trace layout of the circuit board, all positions of electrodes of power supply of each piezo-electric plate are divided and separated from one another. The dimension of an electronic device (such as a liquid crystal display television) is gradually increased, and thus the number of the piezo-electric plates is much gradually increased. For above reason, not only the size of the trace layout of the circuit board is much gradually increased, but also the manufacture of the trace layout of the circuit board is difficult because of complexity.

SUMMARY OF THE INVENTION

It is an object of the present invention to solve the above-mentioned disadvantages.

In order to achieve the foregoing objects, the present invention provides an electrically connecting structure of piezo-electric plates including a circuit board and a plurality of piezo-electric plates disposed on and electrically connected to the circuit board. Anodes of power input of the piezo-electric plates of the present invention are individually electrically connected to the circuit board, and the cathodes of power input of the plurality of piezo-electric plates are electrically connected together for forming a circuit of power input of electrical connection of the plurality of piezo-electric plates and the circuit board. Accordingly, the trace layout of the circuit board is not complex and the circuit board 10 is easily manufactured.

The foregoing, as well as additional objects, features and advantages of the invention will be more readily apparent from the following detailed description, which proceeds with reference to the accompanying drawings.

DESCRIPTION OF THE PREFERRED EMBODIMENTS

Figure 1:
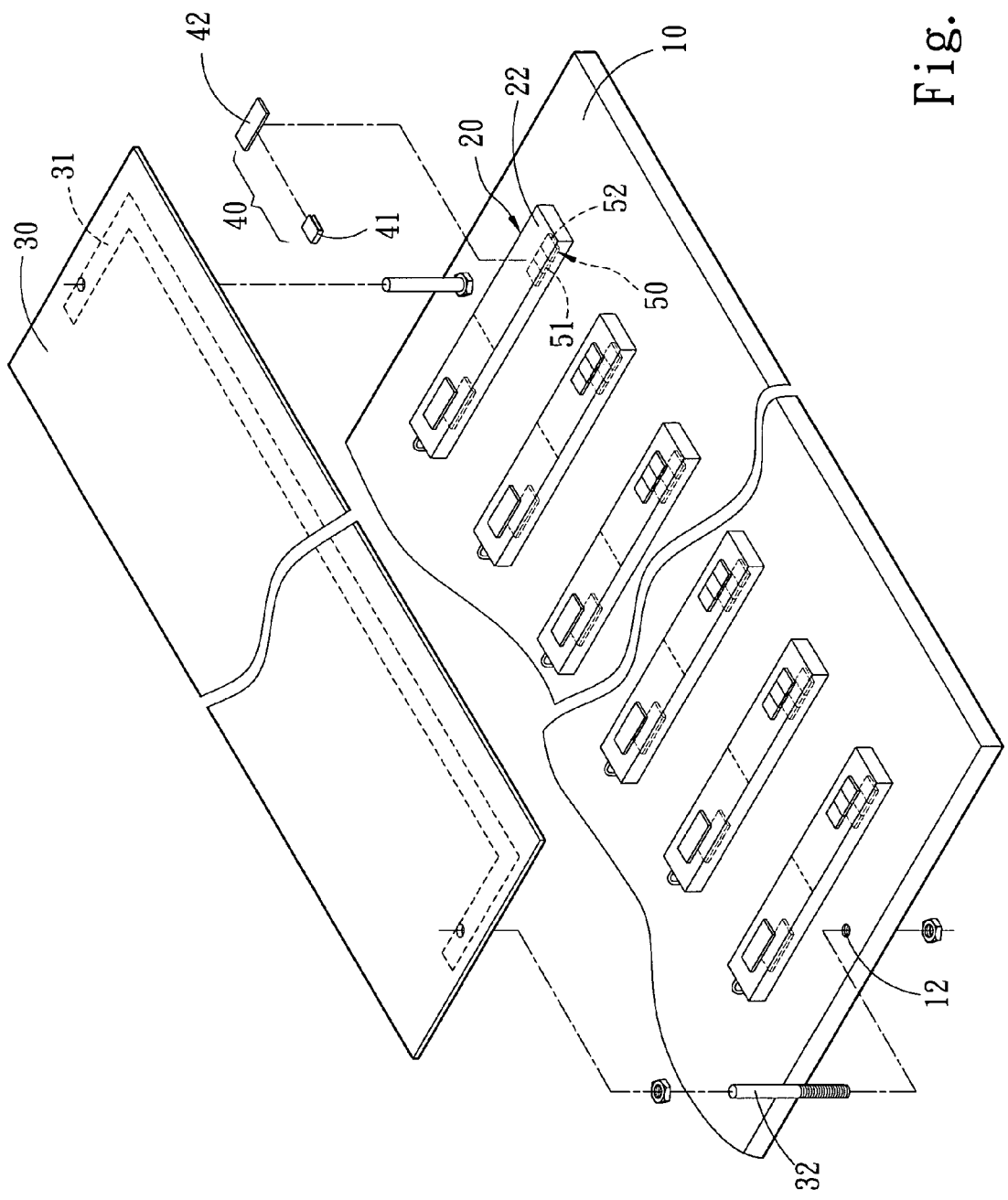
FIG. 1 is an exploded perspective schematic view of an electrically connecting structure of piezo-electric plates according to the first embodiment of the prevent invention.
Figure 2:
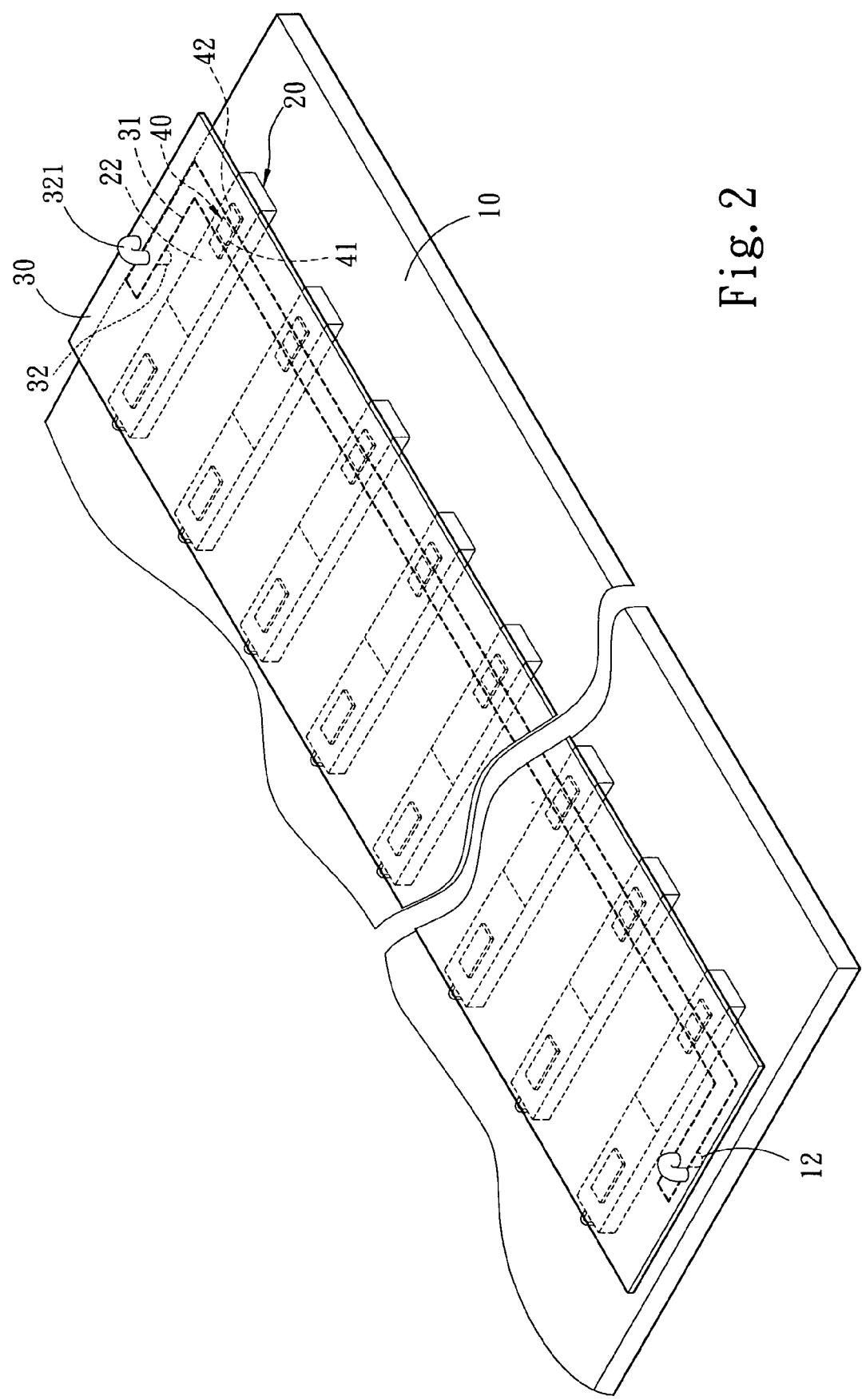
FIG. 2 is a perspective schematic view of an electrically connecting structure of piezo-electric plates according to the first embodiment of the prevent invention.

Referring to FIGS. 1, 2, 3 and 4, they are an exploded perspective view, a perspective view and cross sectional views of an electrically connecting structure of piezo-electric plates according to the first embodiment of the prevent invention. As shown in figures, the prevent invention is kind of the improvement of an electrically connecting structure of piezo-electric plates 20. The electrically connecting structure includes a circuit board 10 and a plurality of piezo-electric plates 20 disposed on and electrically connected to the circuit board 10. Anodes 21 of power input of the piezo-electric plates 20 of the prevent invention are individually electrically connected to the circuit board 10. According to the connecting manner, the anodes 21 of power input are formed on the lower surface of the piezo-electric plates 20, and the circuit board 10 is provided with power contacts 11 corresponding to the anodes 21 of power input. The anode 21 of power input is electrically connected to the power contact 11 by means of a connecting element 50. The connecting element 50 includes a conductive sheet 51 and an elastic body 52. The elastic body 52 has an adhesive surface adhered to the piezo-electric plates 20 and the circuit board 10 for positioning both the piezo-electric plates 20 and the circuit board 10. (According to a preferable embodiment, the surface of the piezo-electric plates 20 can be coated with silver paint for forming the anodes 21 of power input. According to a preferable embodiment, the connecting element 50 is utilized to be in the electrically connecting and positioning manner. However, conventional electrically connecting technology of correlative anode 21 of power input can also utilize the present invention, it is not used to restrain the invention.) The electrically connecting structure of the prevent invention further includes a power inputting plate 30 disposed above the piezo-electric plates 20. The power inputting plate 30 is provided with a contacting trace 31. The contacting trace 31 is electrically connected to the position 12 of a reference cathode disposed on the circuit board 10 by means of a conductive element 32. A plurality of connecting elements 40 are disposed between cathodes 22 of power input of the piezo-electric plates 20 and the contacting trace 31 of the power inputting plate 30, whereby the cathodes 22 of power input of the plurality of piezo-electric plates 20 are electrically connected together.

Figure 3:
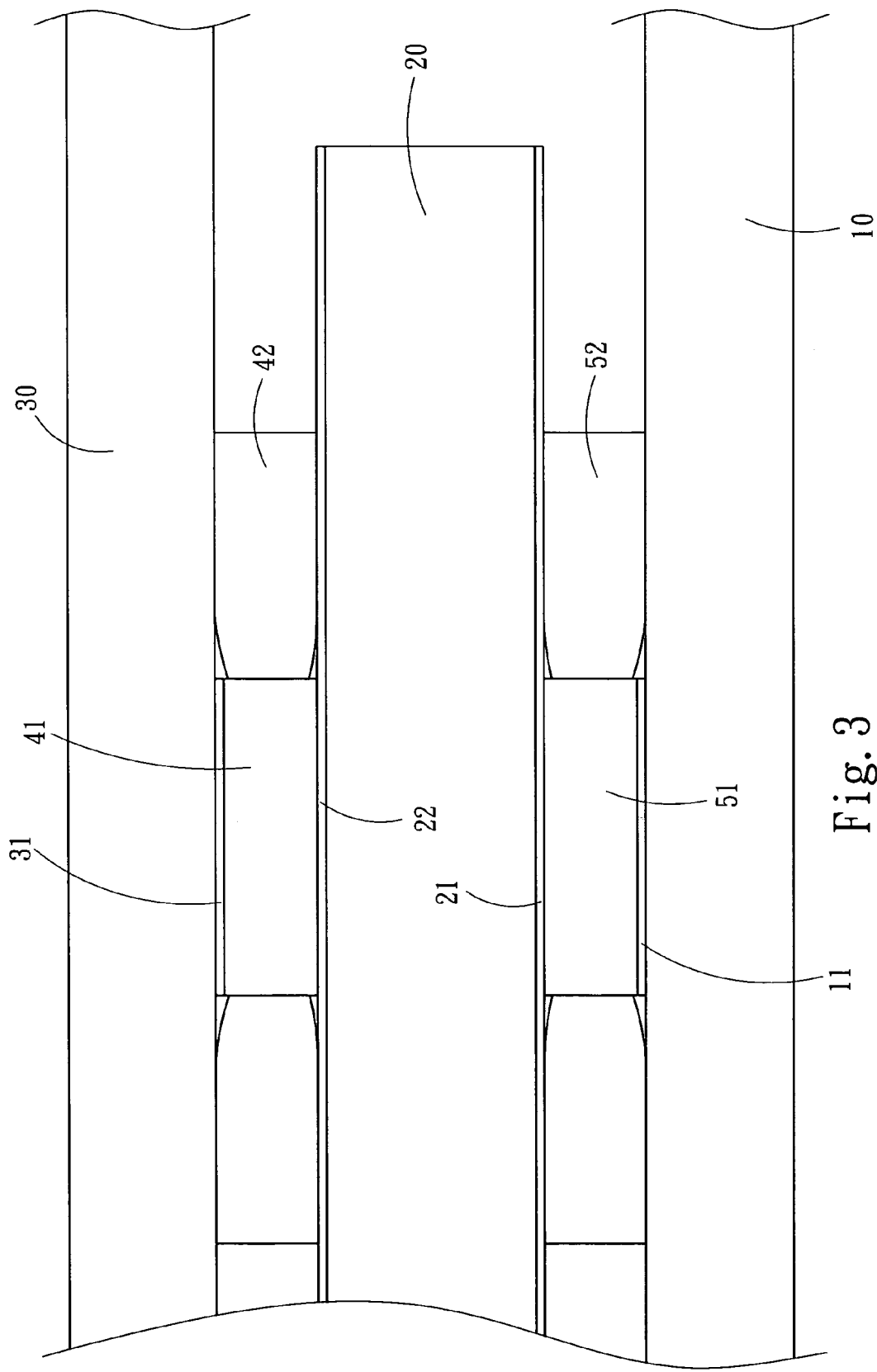
FIGS. 3 and 4 are cross sectional schematic views showing the combinations according to the first embodiment of the prevent invention.
Figure 4:
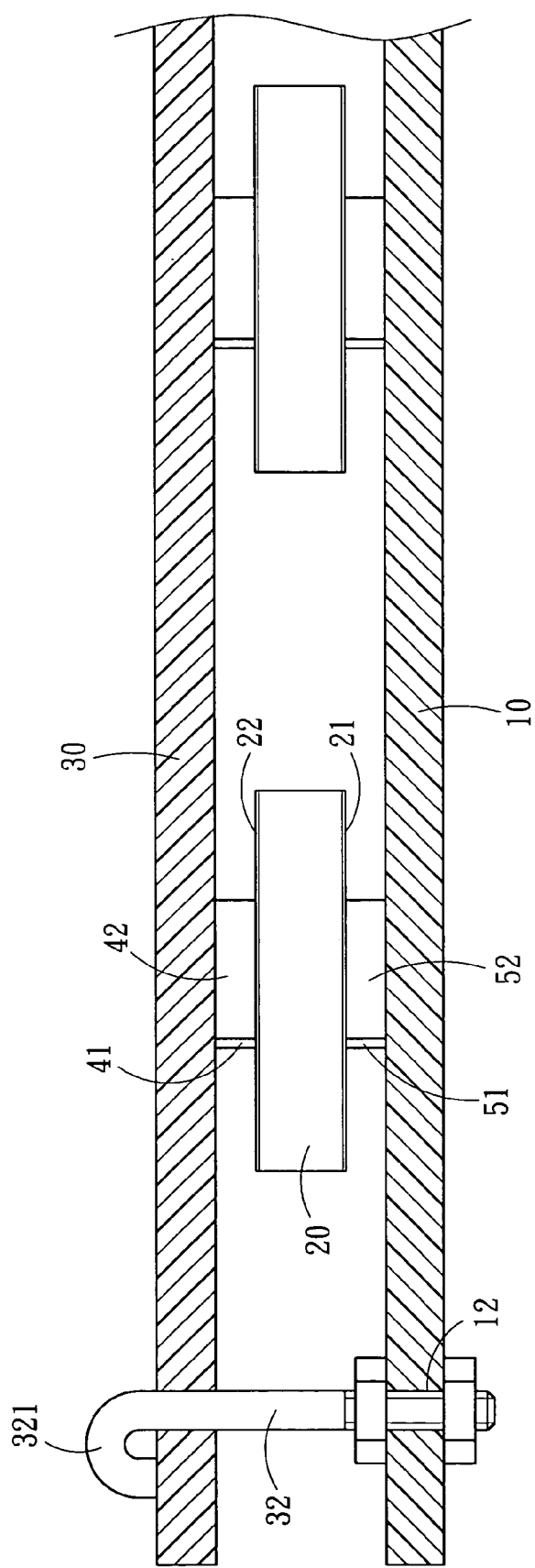

FIGS. 3 and 4 show the combination of the present invention. The plurality of connecting elements 40 of the present invention respectively includes a conductive sheet 41 and an elastic body 42. The elastic body 42 has an adhesive surface adhered to the piezo-electric plates 20 and the power inputting plate 30 for positioning both the piezo-electric plates 20 and the power inputting plate 30. The conductive element 32 includes a constraining end 321 by bending an upper portion of the conductive element 32 toward the power inputting plate 30, whereby the power inputting plate 30 cannot escape from the constraining end 321. When the combination of connection is finished, the cathodes 22 of power input of the plurality of piezo-electric plates 20 are electrically connected to the contacting trace 31 of the power inputting plate 30 by means of the conductive sheets 41 of connecting elements 40, whereby the cathodes 22 of power input of the plurality of piezo-electric plates 20 are electrically connected together. Simultaneously, the contacting trace 31 of the power inputting plate 30 is electrically connected to the position 12 of the reference cathode disposed on the circuit board 10 by means of the conductive element 32. Thus, the anodes 21 of power input of the plurality of piezo-electric plates 20 are respectively electrically connected to the circuit board 10 for forming a circuit of power input, and the trace layout of the power contact 11 of the circuit board 10 is only designed to be corresponding to the anodes 21 of power input of the plurality of piezo-electric plates 20. Furthermore, the position 12 of the reference cathode is only designed to dispose on the circuit board 10 because the cathodes 22 of power input of the plurality of piezo-electric plates 20 are electrically connected together according to the present invention. Accordingly, the circuit board 10 is easily designed and manufactured.

Figure 5:
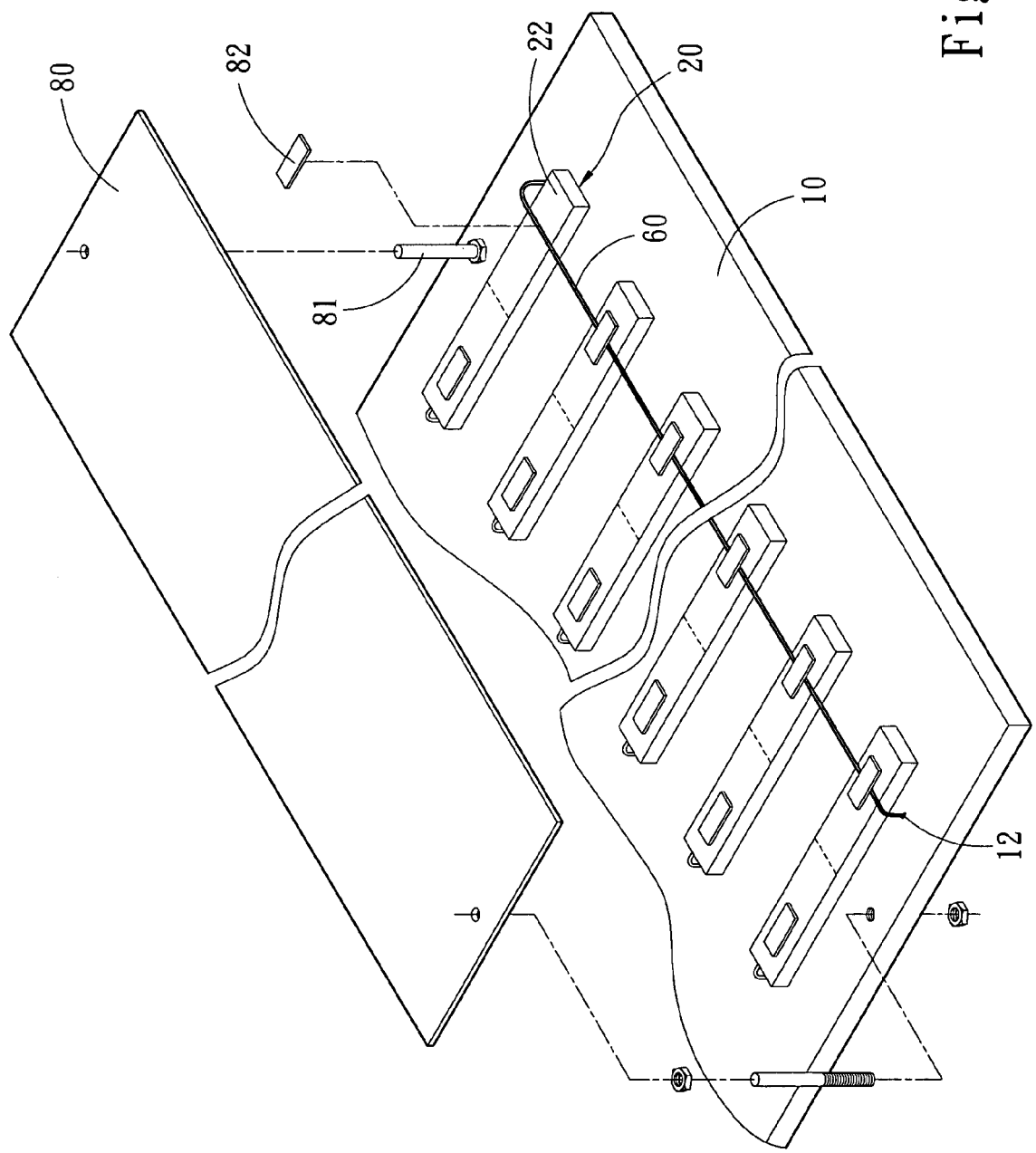
FIG. 5 is an exploded perspective schematic view of an electrically connecting structure of piezo-electric plates according to the second embodiment of the prevent invention.
Figure 6:
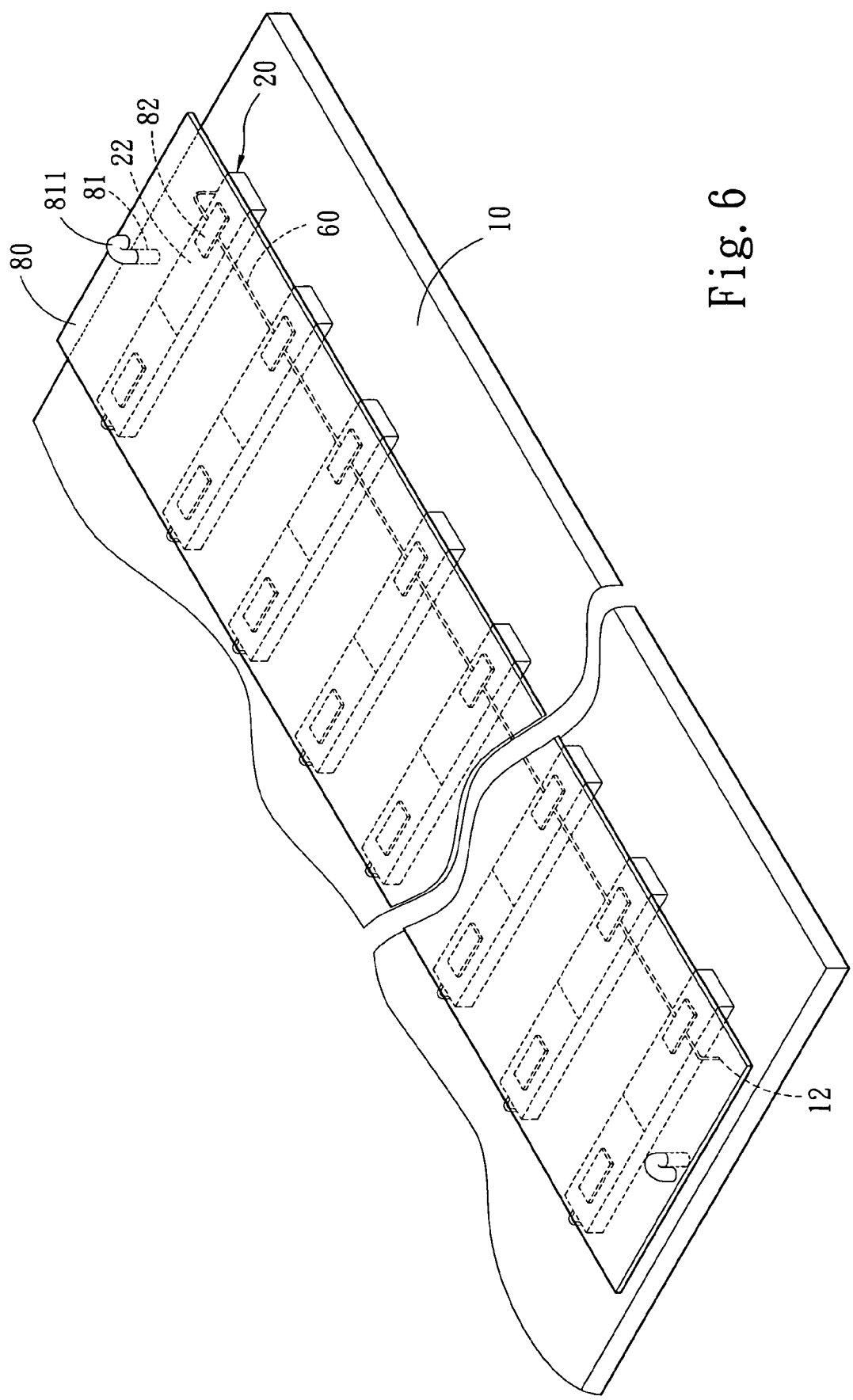
FIG. 6 is a perspective schematic view of an electrically connecting structure of piezo-electric plates according to the second embodiment of the prevent invention.
Figure 7:
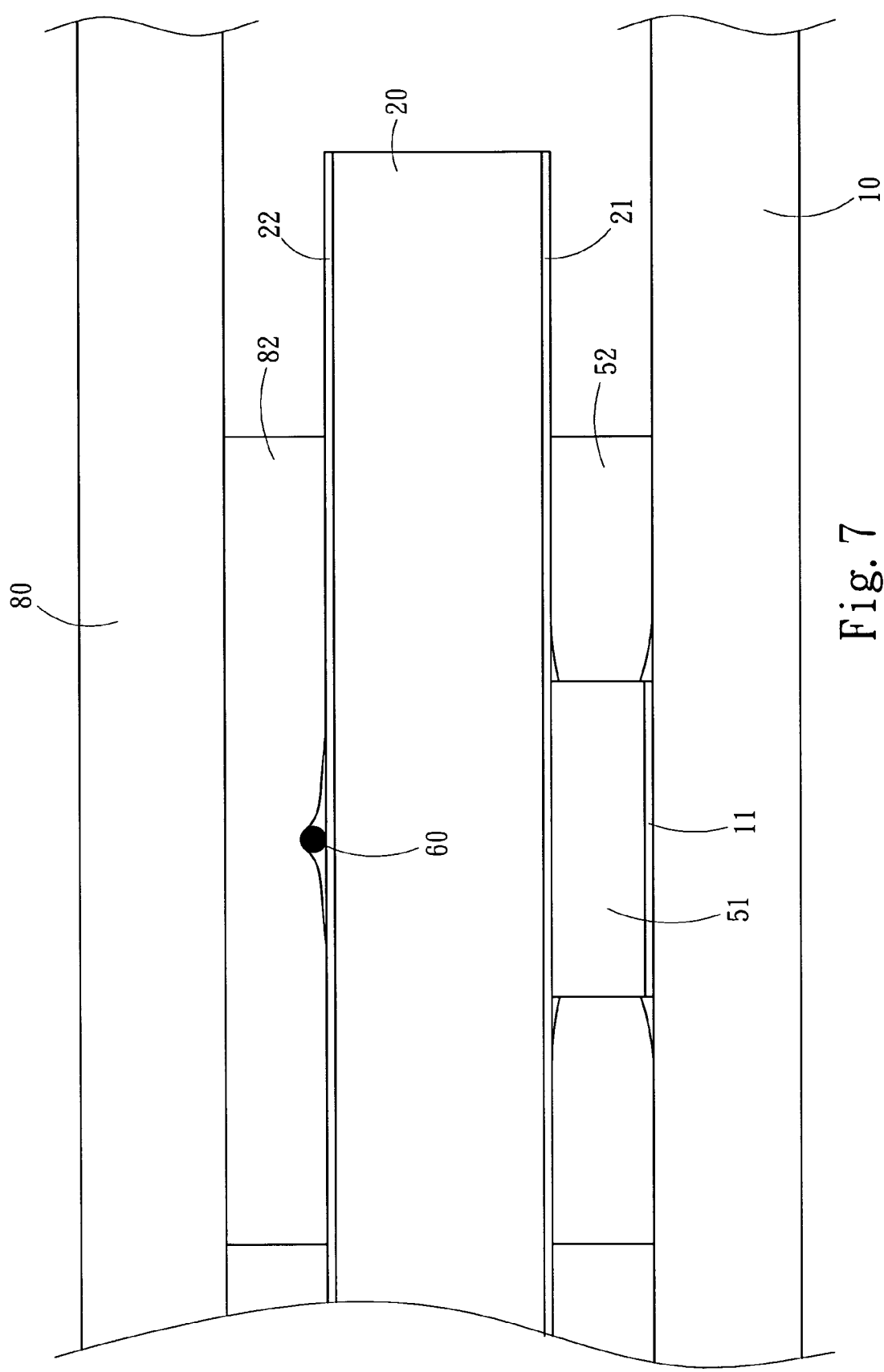
FIG. 7 is a cross sectional schematic view showing the combination according to the second embodiment of the prevent invention.
Figure 8:
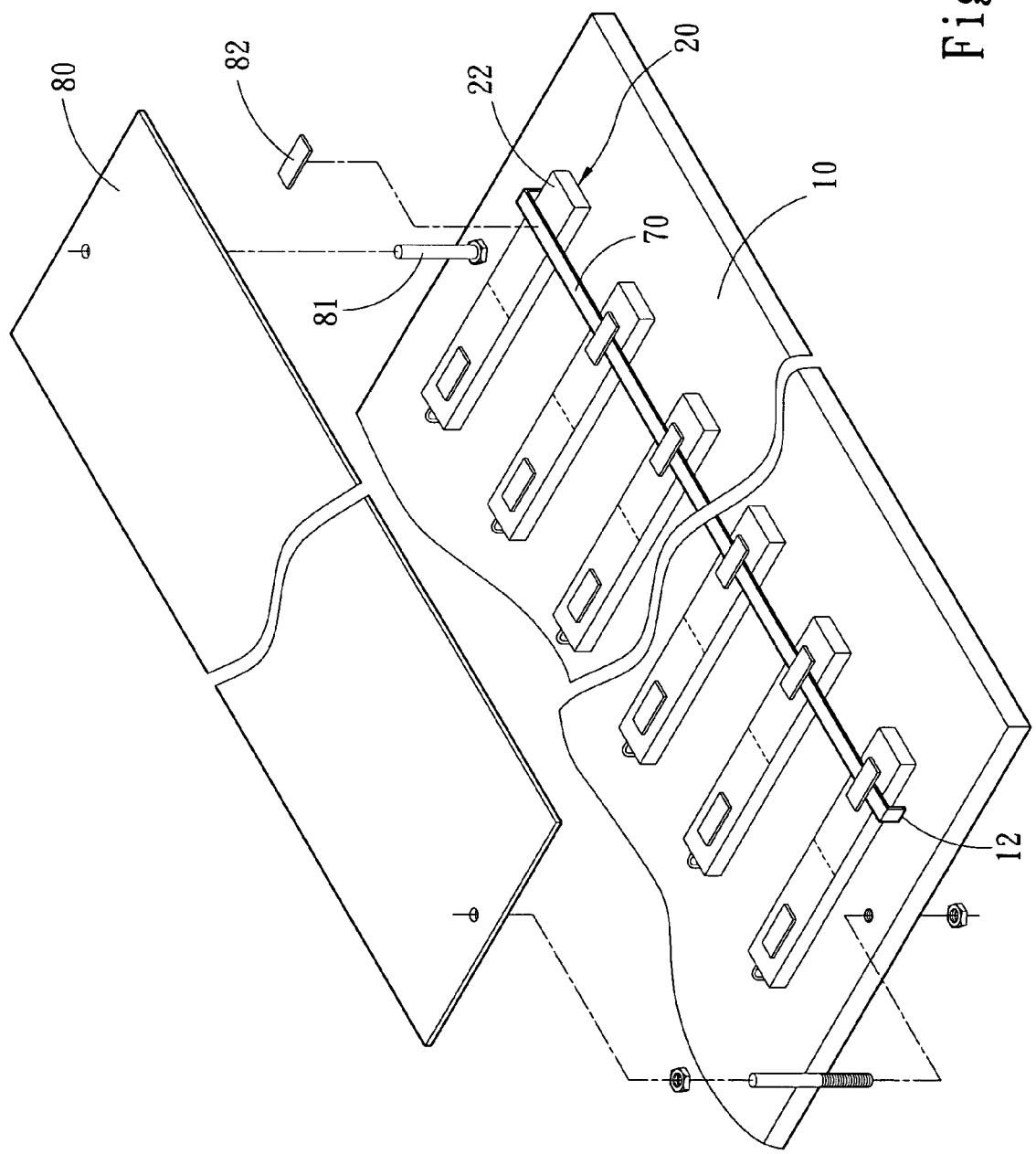
FIG. 8 is an exploded perspective schematic view of an electrically connecting structure of piezo-electric plates according to the third embodiment of the prevent invention.
Figure 9:
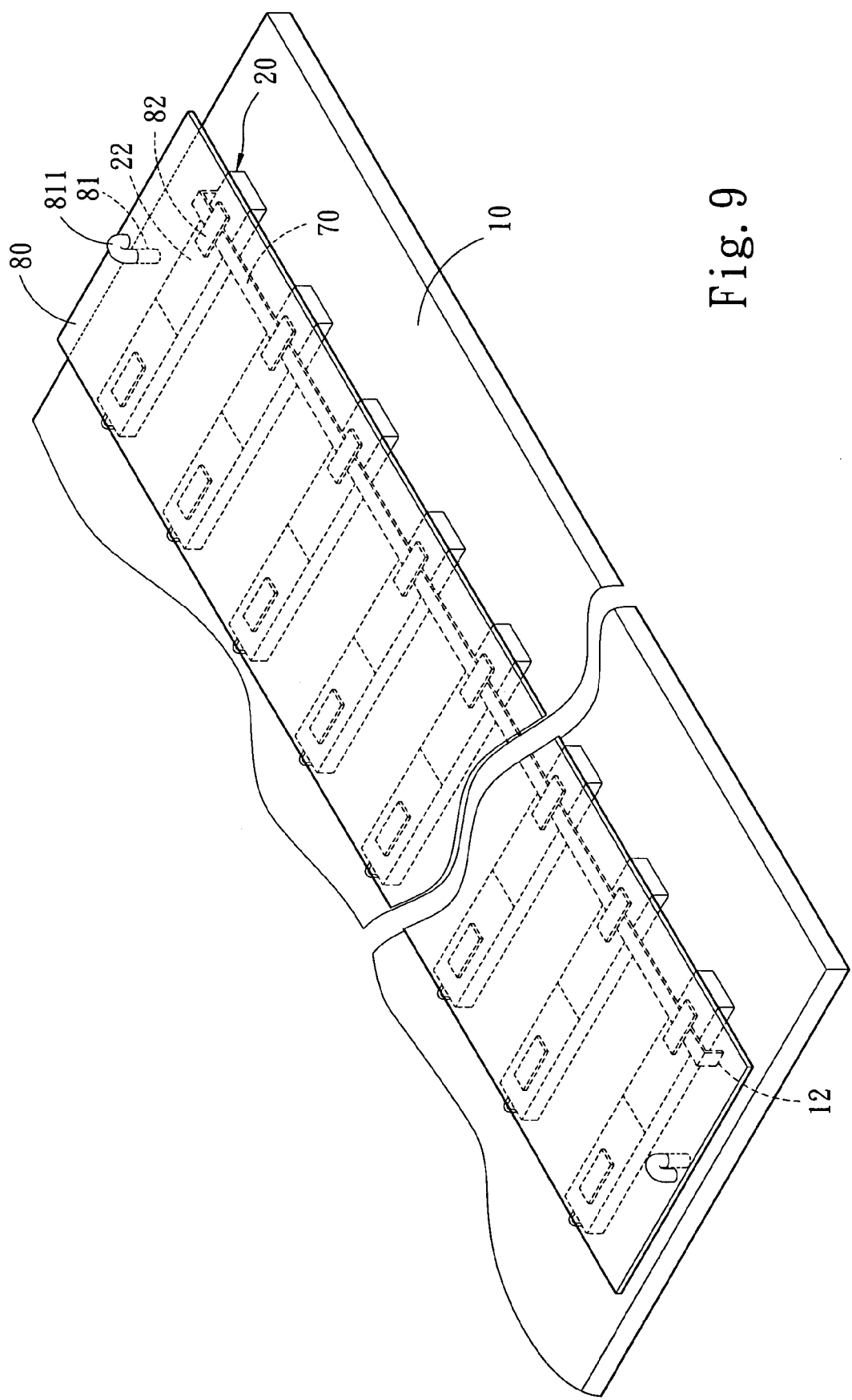
FIG. 9 is a perspective schematic view of an electrically connecting structure of piezo-electric plates according to the third embodiment of the prevent invention.
Figure 10:
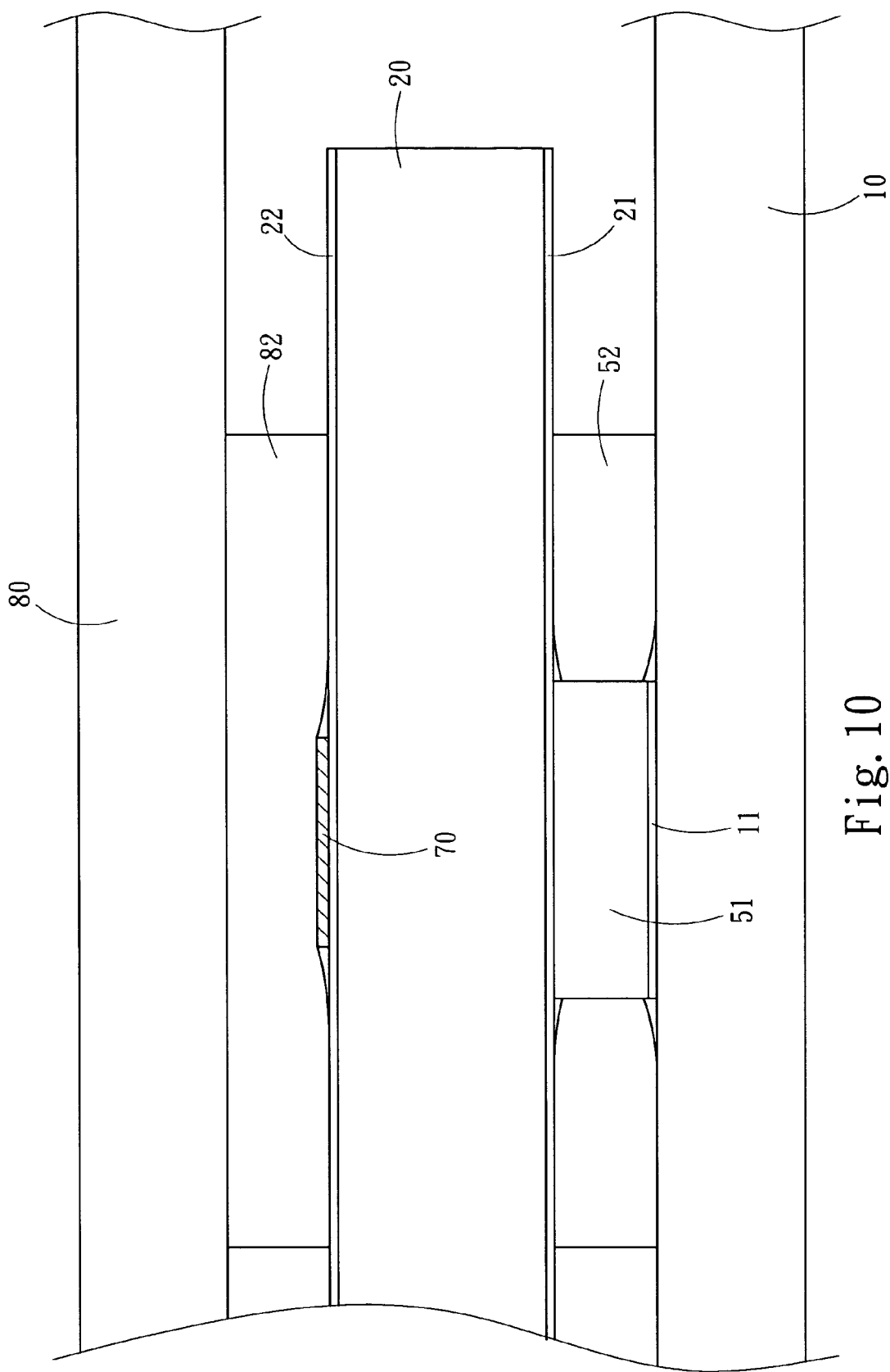
FIG. 10 is a cross sectional schematic view showing the combination according to the third embodiment of the prevent invention.

Referring to FIGS. 5, 6 and 7, they are an exploded perspective view, a perspective view and a cross sectional view of an electrically connecting structure of piezo-electric plates according to the second embodiment of the prevent invention. As shown in figures, likewise the cathodes 22 of power input of the plurality of piezo-electric plates 20 are electrically connected together in the second embodiment, but the cathodes 22 of power input of the plurality of piezo-electric plates 20 are electrically connected together by means of a conductive element 60, in the second embodiment. In the second embodiment, the conductive element 60 can be made of metal conductive line material. In the third embodiment, the conductive element 70 can be made of metal conductive sheet material, shown in FIGS. 8, 9 and 10. During manufacture, the anodes 21 of power input of the plurality of piezo-electric plates 20 are respectively electrically connected to the circuit board 10 (the manufacture is the same as that in the first embodiment). Then, the conductive element 60, 70 is disposed at and together electrically connected to the cathodes 22 of power input of the plurality of piezo-electric plates 20. Simultaneously, the conductive element 60, 70 has at least one end electrically connected to the position 12 of the reference cathode disposed on the circuit board 10. A positioning plate 80 is further disposed on the conductive element 60, 70, and elastic bodies 82 are disposed between the positioning plate 80 and the piezo-electric plates 20 and has an adhesive surface adhered to the piezo-electric plates 20 and the power inputting plate 30 for positioning both the piezo-electric plates 20 and the positioning plate 80. A mounting element 81 is disposed between the positioning plate 80 and the circuit board 10. The mounting element 81 includes a constraining end 811 by bending an upper portion of the mounting element 81 toward the positioning plate 80, whereby the positioning plate 80 cannot escape from the constraining end 811, and the constraining end 811 can helpfully position the positioning plate 80. As shown in figures, the cathodes 22 of power input of the plurality of piezo-electric plates 20 are electrically connected together according to the second and third embodiments of the present invention together with the first embodiment. Accordingly, the circuit board 10 is easily designed and manufactured.

Although the invention has been explained in relation to its preferred embodiment, it is not used to restrain the invention. It is to be understood that many other possible modifications and variations can be made by those skilled in the art without departing from the spirit and scope of the invention as hereinafter claimed.

What is claimed is:

1. An electrically connecting structure of piezo-electric plates comprising a circuit board and a plurality of piezo-electric plates disposed on and electrically connected to the circuit board, comprising:

anodes of power input of the piezo-electric plates are individually electrically connected to the circuit board, the cathodes of power input of the plurality of piezo-electric plates are electrically connected together by means of a conductive element, and the conductive element has at least one end electrically connected to a position of the reference cathode disposed on the circuit board for forming a circuit of power input of electrical connection of the plurality of piezo-electric plates and the circuit board; the anodes of power input being formed on the lower surface of the piezo-electric plates, and the circuit board being provided with power contacts corresponding to the anodes of power input; and a connecting element for electrically connecting the anode of power input to the power contact, wherein the connecting element includes a conductive sheet and an elastic body having an adhesive surface adhered to the piezo-electric plates and the circuit board for positioning both the piezo-electric plates and the circuit board.

2. The electrically connecting structure of piezo-electric plates according to claim 1, further comprising a positioning plate and elastic bodies, wherein the positioning plate is disposed on the conductive element, and the elastic bodies are disposed between the positioning plate and the piezo-electric plates and has an adhesive surface adhered to the piezo-electric plates and the power inputting plate for positioning both the piezo-electric plates and the positioning plate.

3. The electrically connecting structure of piezo-electric plates according to claim 2, wherein the conductive element is made of metal conductive line material.

4. The electrically connecting structure of piezo-electric plates according to claim 2, wherein the conductive element is made of metal conductive sheet material.

5. The electrically connecting structure of piezo-electric plates according to claim 2, further comprising a mounting element disposed between the positioning plate and the circuit board for helpfully positioning the positioning plate.

6. The electrically connecting structure of piezo-electric plates according to claim 5, wherein the mounting element comprises a constraining end by bending an upper portion of the mounting element toward the positioning plate, whereby the positioning plate cannot escape from the constraining end.

7. An electrically connecting structure of piezo-electric plates comprising:
  a circuit board;
  a plurality of piezo-electric plates disposed on and electrically connected to the circuit board, wherein the anodes of power input of the piezo-electric plates are individually electrically connected to the circuit board;
  the anodes of power input being formed on the lower surface of the piezo-electric plates, and the circuit board being provided with power contacts corresponding to the anodes of power input; and
  a power inputting plate disposed above the piezo-electric plates and provided with a contacting trace electrically connected to a position of a reference cathode disposed on the circuit board by means of a conductive element;
  a plurality of connecting elements disposed between cathodes of power input of the piezo-electric plates and the contacting trace of the power inputting plate, whereby the cathodes of power input of the plurality of piezo-electric plates are electrically connected together; and
  a connecting element for electrically connecting the anode of power input to the power contact, wherein the connecting element comprises a conductive sheet and an elastic body having an adhesive surface adhered to the piezo-electric plates and the circuit board for positioning both the piezo-electric plates and the circuit board.

8. The electrically connecting structure of piezo-electric plates according to claim 7, wherein the plurality of connecting elements individually comprise a conductive sheet and an elastic body having an adhesive surface adhered to the piezo-electric plates and the power inputting plate for positioning both the piezo-electric plate and the power inputting plate.

9. The electrically connecting structure of piezo-electric plates according to claim 7, wherein the conductive element includes a constraining end by bending an upper portion of the conductive element toward the power inputting plate, whereby the power inputting plate cannot escape from the constraining end.

* * * * *